United States Patent
Yi et al.

(10) Patent No.: US 10,064,271 B2
(45) Date of Patent: Aug. 28, 2018

(54) PCB PROCESSING METHOD AND PCB

(71) Applicant: ZTE CORPORATION, Guangdong (CN)

(72) Inventors: Bi Yi, Guangdong (CN); Fengchao Ma, Guangdong (CN); Yonghui Ren, Guangdong (CN); Wang Xiong, Guangdong (CN); Yingxin Wang, Guangdong (CN)

(73) Assignee: ZTE CORPORATION, Guangdong (CN)

( * ) Notice: Subject to any disclaimer, the term of this patent is extended or adjusted under 35 U.S.C. 154(b) by 0 days.

(21) Appl. No.: 15/108,405

(22) PCT Filed: May 21, 2014

(86) PCT No.: PCT/CN2014/078052
§ 371 (c)(1),
(2) Date: Jun. 27, 2016

(87) PCT Pub. No.: WO2015/096365
PCT Pub. Date: Jul. 2, 2015

(65) Prior Publication Data
US 2016/0323995 A1 Nov. 3, 2016

(30) Foreign Application Priority Data
Dec. 27, 2013 (CN) .......................... 2013 1 0739302

(51) Int. Cl.
*H05K 1/02* (2006.01)
*H05K 1/09* (2006.01)
(Continued)

(52) U.S. Cl.
CPC .............. *H05K 1/0298* (2013.01); *H05K 1/09* (2013.01); *H05K 1/115* (2013.01); *H05K 3/0047* (2013.01);
(Continued)

(58) Field of Classification Search
CPC ...... H05K 1/0298; H05K 1/115; H05K 1/116; H05K 1/117; H05K 3/0047
See application file for complete search history.

(56) References Cited

U.S. PATENT DOCUMENTS

2004/0144564 A1* 7/2004 Hoffmann ............ H05K 3/4623
174/266
2012/0302075 A1* 11/2012 Muraoka .............. H05K 1/0251
439/78
2013/0330941 A1* 12/2013 Jeon ..................... H01R 12/585
439/65

FOREIGN PATENT DOCUMENTS

| CN | 101 695 224 | 4/2010 |
| CN | 102 316 682 | 1/2012 |

OTHER PUBLICATIONS

International Search Report for PCT/CN2014/078052 dated Sep. 29, 2014, 4 pages.

* cited by examiner

*Primary Examiner* — Timothy Thompson
*Assistant Examiner* — Amol Patel
(74) *Attorney, Agent, or Firm* — Nixon & Vanderhype P.C.

(57) ABSTRACT

The present disclosure discloses a PCB processing method and a PCB. The method includes: respectively carrying out laminating processing on a plurality of PCB daughter boards constituting a PCB, and drilling and electroplating the top-most PCB daughter board to form a via hole; and laminating the plurality of PCB daughter boards together to form the PCB, and drilling and electroplating the formed PCB to form a through hole for mounting a connector, wherein a blind hole for mounting a connector is formed by the via hole, and a depth of the blind hole is greater than or equal to the length of a signal pin of the connector. By virtue
(Continued)

of the technical scheme of the present disclosure, a space between wafers of the lower layer of PCBs may be doubled, and the space for layout between wafers may be doubled.

10 Claims, 5 Drawing Sheets

(51) Int. Cl.
*H05K 3/46* (2006.01)
*H05K 1/11* (2006.01)
*H05K 3/42* (2006.01)
*H05K 3/00* (2006.01)

(52) U.S. Cl.
CPC ............ *H05K 3/424* (2013.01); *H05K 3/429* (2013.01); *H05K 3/4611* (2013.01); *H05K 2201/10303* (2013.01); *H05K 2203/16* (2013.01)

PCB of upper layer

PCB of upper layer

PCB PROCESSING METHOD AND PCB

CROSS-REFERENCES TO RELATED APPLICATIONS

This application is a United States national phase application of co-pending international patent application number PCT/CN2014/078052, filed on May 21, 2014 which claims priority to a Chinese patent application No. 201310739302.6 filed on Dec. 27, 2014, disclosures of both of which are incorporated herein by reference in their entireties.

TECHNICAL FIELD

The present disclosure relates to the field of PCB technologies, and in particular, to a PCB processing method and a PCB.

BACKGROUND

With the increasing of a user data traffic volume, assembling printed circuit boards (abbreviated as PCB) and connectors is widely used in a communication system to implement the transmission of inter-board signals. The capacity of a typical switching system reaches 10 T, and up to hundreds of connectors are used. Very high requirements for the density of the connectors and the rate of single channels are proposed because very high communication capacity needs to be met and so many single boards and connectors need to be installed in a cabinet having a limited space. Currently, the single channel rate of the connectors has been raised more than 25 Gbps, and the minimum distance between connector wafers is only 1.85 mm. The density of the connectors has to be reduced to further improve the single channel rate of the connectors. The density and rate of the connectors are actually contradictory. Connector manufacturers make great efforts in the design of high-rate and high-density connectors. At present, a through hole is generally designed on a PCB for crimping the connectors. As a result, the wiring space of the PCB is limited by the space between wafers. During the research of the present invention, inventors found that the existing art at least has the following problems. After a connector type is determined, the space for layout between wafers on the PCB is limited. Due to through hole crimping, the deeper the backdrilling is, the larger the depth tolerance of a backdrilled hole is, and the poorer the control of a stub is.

This section provides background information related to the present disclosure which is not necessarily prior art.

SUMMARY

This section provides a summary of various of implementations or examples of the technology described in the disclosure, and is not a comprehensive disclosure of the full scope or all features if the disclosed technology.

The present disclosure provides a PCB processing method, including: respectively carrying out lamination processing on a plurality of PCB daughter boards constituting a PCB, and drilling and electroplating a top-most PCB daughter board of the PCB to form a via hole; laminating the plurality of PCB daughter boards together to form the PCB, and drilling and electroplating the formed PCB to form a through hole for mounting a connector, wherein a depth of the blind hole is greater than or equal to a length of a signal pin of the connector.

Optionally, after drilling and electroplating the top-most PCB daughter board of the PCB to form a via hole, the method further includes: backdrilling at least one via hole.

Optionally, the blind hole has a metallized part after backdrilling, and a length of the metallized part is greater than or equal to that of the signal pin of the connector.

Optionally, drilling and electroplating the formed PCB to form a through hole for mounting the connector includes: drilling and electroplating the formed PCB at preset intervals to form multiple through holes for mounting connectors.

Optionally, after drilling and electroplating the formed PCB to form a through hole for mounting the connector, the method further includes: backdrilling at least one through hole.

Optionally, the method further includes: determining a position of the through hole and of the blind hole according to wiring pattern of the PCB.

Optionally, the top-most PCB daughter board is formed by laminating a core board and a dielectric.

Optionally, the bottom-most PCB daughter board of the plurality of PCB daughter boards constituting the PCB is formed by directly processing a core board or is formed by the core board and a dielectric.

The present disclosure further provides a PCB fabricated by the foregoing printed circuit board PCB processing method, the PCB is formed by laminating multilayer PCB daughter boards, and the PCB is provided with a blind hole and a through hole for mounting a connector.

Optionally, the blind hole and the through hole are backdrilled.

In the case where the density of the connector is constant, the blind hole is formed by twice or more laminations, a space between wafers of the lower layer of PCBs may be doubled, and the space for layout between wafers may be doubled.

The foregoing description is merely a summarization of the technical schemes of the present disclosure, and may be implemented in accordance with the contents of the specification to more clearly understand the technological means of the present disclosure. The embodiments of the present invention are given to make the foregoing and other objectives, features and advantages of the present disclosure more apparent.

BRIEF DESCRIPTION OF DRAWINGS

Various other advantages and benefits will become apparent to those of ordinary skill in the art by reading the detailed description of the following optional embodiments. The drawings are merely intended for showing optional embodiments, but are not deemed to limit the present disclosure. Furthermore, in the whole drawings, the same reference marks denote the same parts. In the figures.

DETAILED DESCRIPTION

The following will describe in more detail the exemplary embodiments of the present disclosure with reference to the drawings. Although the drawings display the exemplary embodiments of the present disclosure, it should be understood that the present disclosure may be implemented in various forms but not limited by the embodiments set forth herein. Instead, these embodiments are provided to more thoroughly understand the present disclosure, and completely convey the scope of the present disclosure to those skilled in the art.

As mentioned above, in the existing art, connectors are mounted by crimping, and all crimping holes are designed as through holes. This manner has a disadvantage that the distance between two wafers of the connector is quite small so that the space of connector for layout is very small. The density of the connectors has to be reduced if the space for layout is increased. In order to solve the aforementioned problem, the embodiments of the present disclosure provide a printed circuit board PCB processing method and a PCB, which may enable the space for layout between wafers to be doubled without reducing the density of the connector. Furthermore, the stub in the crimping of the blind hole may be effectively reduced by adopting multiple backdrilling before crimping. The following further describes in detail the present invention with reference to the drawings and the embodiments. It should be understood that the embodiments described herein are merely used to explain the present disclosure, and are not intended to limit the present disclosure.

Method Embodiments

Figure 1:
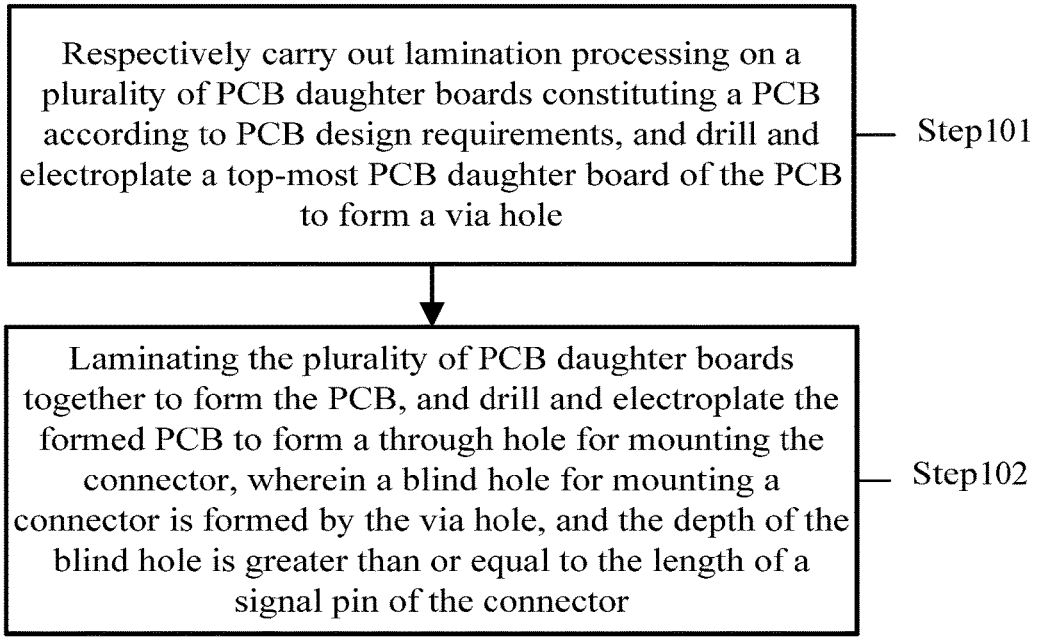
FIG. 1 is a flowchart of a PCB processing method according to embodiments of the present disclosure.

According to the embodiments of the present invention, a PCB processing method is provided. FIG. 1 is a flowchart of a PCB processing method according to the embodiments of the present invention. As shown in FIG. 1, the PCB processing method according to the embodiments of the present invention includes processing in the following Step 101 to Step 102.

Step 101: lamination processing is respectively carried out on a plurality of PCB daughter boards 1 constituting a PCB according to PCB design requirements, and a top-most PCB daughter board of the PCB is drilled and electroplated to form a via hole 2, where the top-most PCB daughter board is formed by laminating a core board 3 and a dielectric 4. A bottom-most PCB daughter board of the plurality of PCB daughter boards constituting the PCB is formed by directly processing a core board or is formed by laminating the core board and a dielectric.

After the via hole is formed by drilling and electroplating the top-most PCB daughter board of the PCB, the via hole that needs to be backdrilled may be backdrilled. The blind hole has a metallized part after backdrilling, and a length of the metallized part is greater than or equal to that of the signal pin of the connector.

Step 102: the plurality of PCB daughter boards 1 are laminated together to form the PCB, and the formed PCB is drilled and electroplated to form a through hole 5 for mounting the connector, wherein a blind hole for mounting a connector is formed by the via hole, and a depth of the blind hole is greater than or equal to a length of the signal pin 6 of the connector.

In Step 102, the formed PCB may be drilled and electroplated at preset intervals to form multiple through holes for mounting connectors. And the through hole that needs to be backdrilled may be backdrilled.

In this embodiment of the present invention, a position of the through hole and of the blind hole may be determined according to the wiring pattern of the PCB. For example, optionally, in this embodiment of the present invention, the connector may be crimped by using the blind hole every other wafer.

Figure 2:
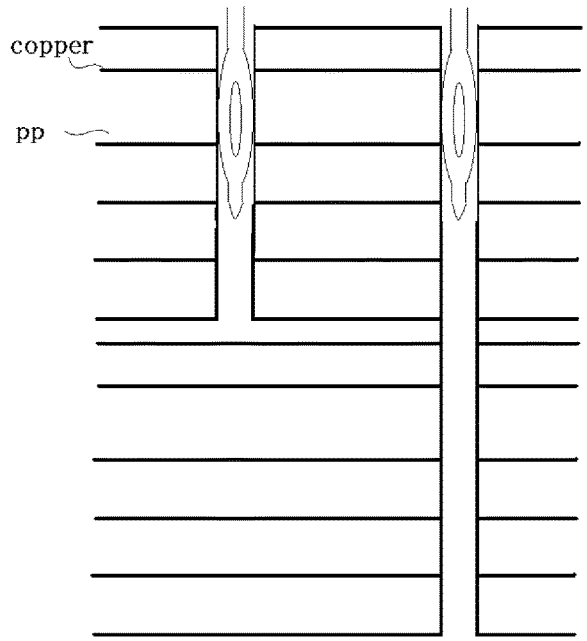
FIG. 2 is a schematic assembly diagram without backdrilling according to the embodiments of the present disclosure.
Figure 3:
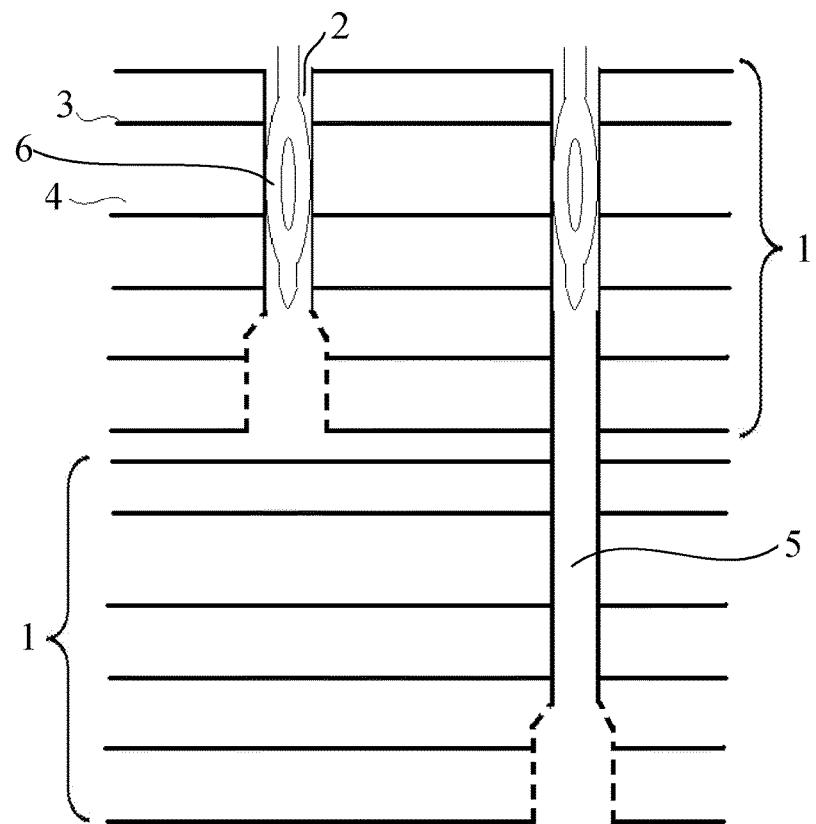
FIG. 3 is a schematic assembly diagram with backdrilling according to the embodiments of the present disclosure.

As mentioned above, the embodiments of the present invention propose a PCB processing method for connector crimping. The blind hole is formed by twice or more laminations. And where in terms of design and processing, it is needed to guarantee that the depth of the blind hole is greater than the length of the signal pin of the connector, so as to guarantee that the connector may be inserted from the blind hole by crimping. schematic assembly diagram without backdrilling is as shown in FIG. 2. In a PCB design, if both a PCB of upper layer and a PCB of lower layer need to be backdrilled, the backdrilling of the PCB of upper layer needs to be carried out before laminating, the blind hole has a metallized part after backdrilling, and a length of the metallized part is greater than that of the signal pin of the connector, which guarantees that the connector may be inserted from the blind hole by crimping. The backdrilling of the lower layer of PCB is carried out upon completion of laminating of the PCB of upper layer and PCB of lower layer. To such a design, the schematic assembly diagram with backdrilling is as shown in FIG. 3. If the wiring space needs to be further increased, one through hole may be formed every other two rows, or the position of the through hole and of the blind hole may be freely deployed according to the wiring pattern to achieve the optimum wiring effect.

Figure 4:
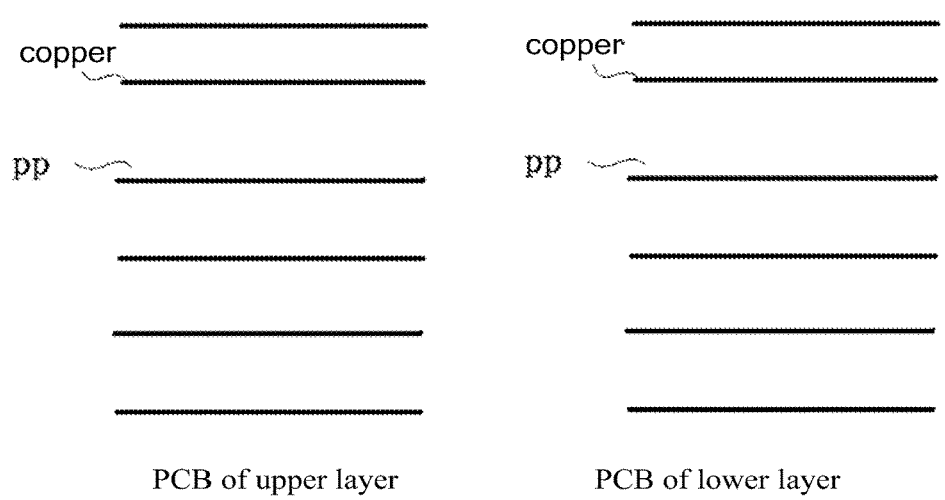
FIG. 4 is a schematic diagram of PCB daughter board of upper layer and PCB daughter board of lower layer according to the embodiments of the present disclosure.

The following makes a detailed description of the specific processing method of the embodiments of the present invention with reference to drawings and by taking two PCB daughter boards, i.e. a PCB daughter board of a upper layer and a PCB daughter board of a lower layer, as an example:

Step 201: the PCB daughter board of upper layer is processed first according to requirements, the PCB daughter board of lower layer part is processed by directly using a core board, or is processed by multilayer core boards and prepreg PP, where core boards are formed by laminating copper foils the dielectric (PP), as shown in FIG. 4.

Figure 5:
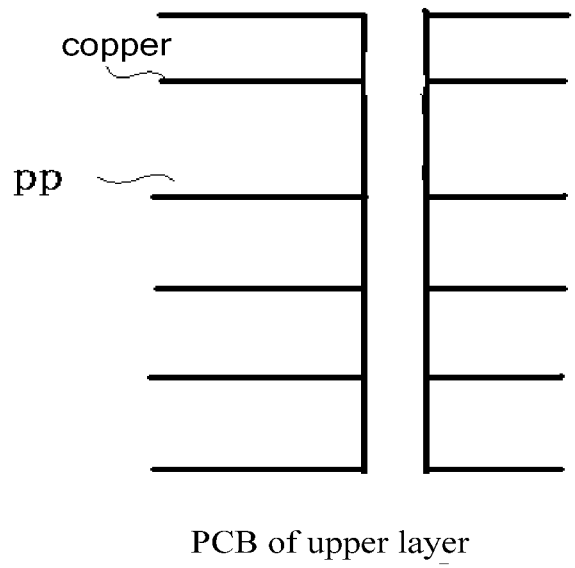
FIG. 5 is a schematic diagram of drilling and electroplating the PCB daughter board of upper layer according to the embodiments of the present disclosure.

Step 202: the PCB daughter board of upper layer is drilled and electroplated, as shown in FIG. 5.

Figure 6:
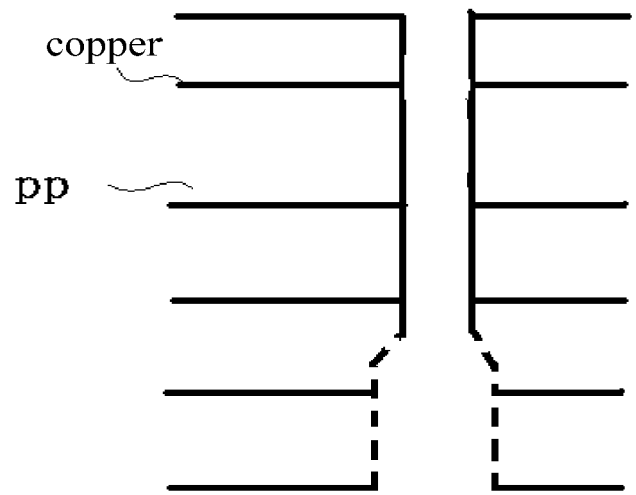
FIG. 6 is a schematic diagram of backdrilling the PCB daughter board of upper layer according to the embodiments of the present disclosure.

Step 203: the via hole needed in the PCB daughter board of upper layer is backdrilled, as shown in FIG. 6. This step can be omitted if no via hole is designed to be backdrilled.

Figure 7:
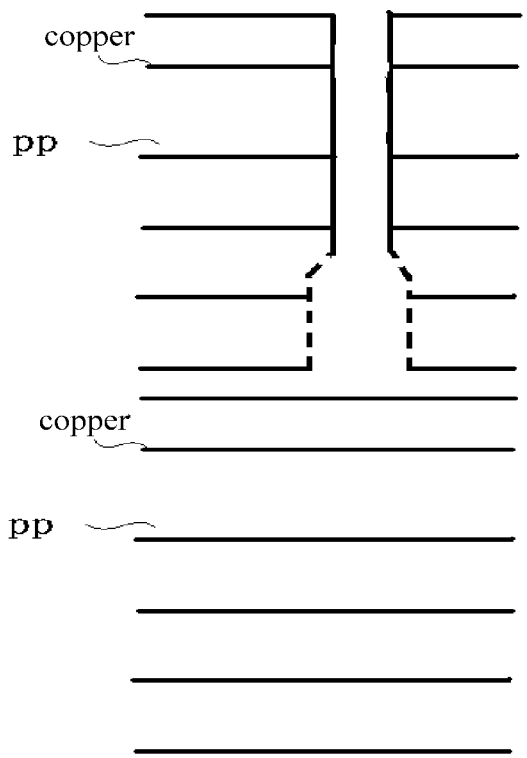
FIG. 7 is a schematic diagram of laminating the PCB daughter board of upper layer and PCB daughter board of lower layer according to the embodiments of the present disclosure.

Step 204: the PCB daughter board of upper layer and PCB daughter board of lower layer are laminated together, as shown in FIG. 7.

Figure 8:
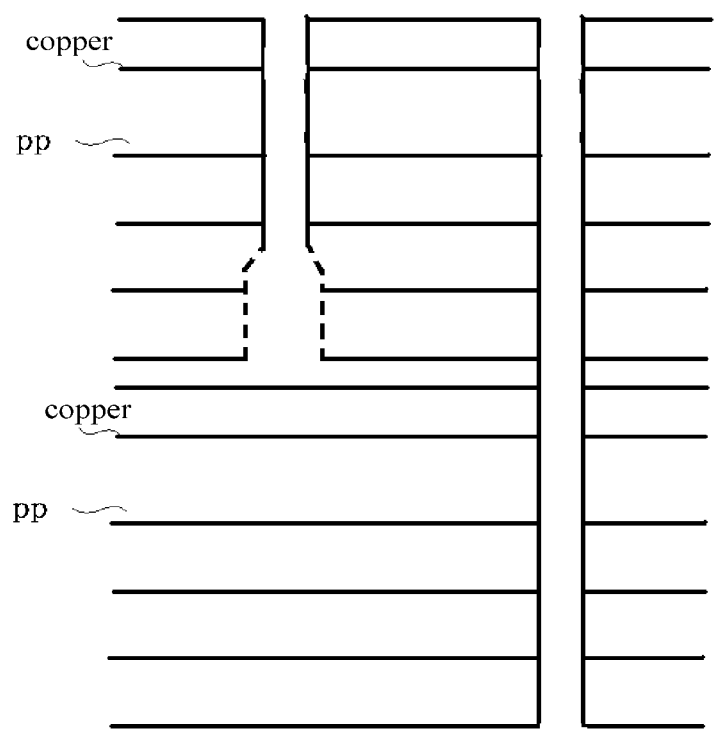
FIG. 8 is a schematic diagram of drilling the PCB daughter board of upper layer and PCB daughter board of lower layer after laminating according to the embodiments of the present invention disclosure.

Step 205: the position of the crimping hole of the connector is drilled and electroplated, as shown in FIG. 8.

Figure 9:
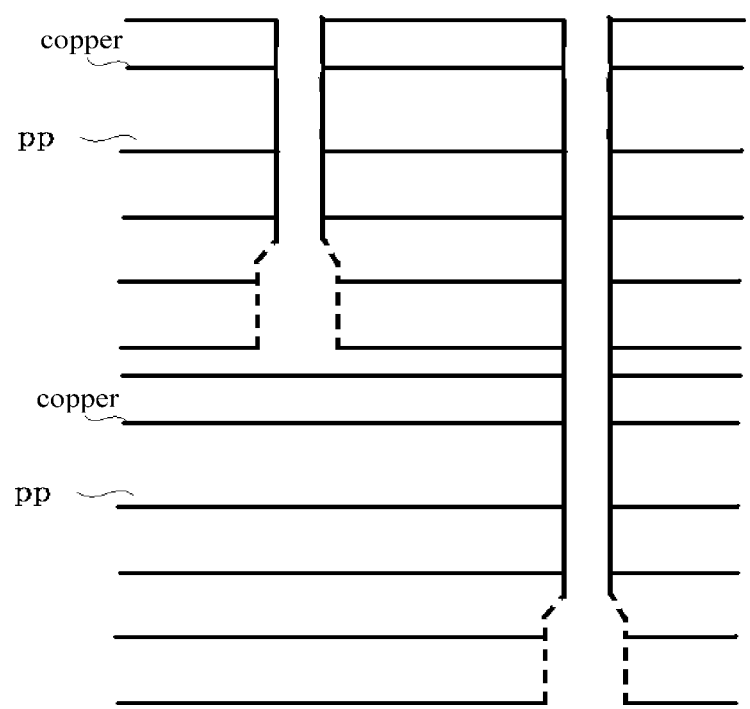
FIG. 9 is a schematic diagram of backdrilling the PCB daughter board of upper layer and PCB daughter board of lower layer after laminating according to the embodiments of the present disclosure.

Step 206: at least one through hole is backdrilled, as shown in FIG. 9. This step can be omitted if no through hole is designed to be backdrilled.

After the foregoing processing, the connector may be assembled, and the schematic diagram after assembly is as shown in FIG. 2 and FIG. 3.

In conclusion, through the technical schemes of the embodiments of the present invention, in the case where the density of the connector is constant, wafers between lower layer of PCB may be doubled via reasonably designing the crimping of PCB and connectors, namely by means of twice or more laminations, so that the wiring space between wafers may be doubled. In addition, according to the technical schemes of the embodiments of the present invention, the blind hole is backdrilled before multiple laminating, which may effectively reduce the length of the stub.

Device Embodiments

According to the embodiments of the present invention, there is provided a PCB fabricated by the foregoing PCB processing method, as shown in FIG. 2 or FIG. 3, the PCB according to the embodiments of the present invention is formed by laminating multilayer PCB daughter boards, and the PCB is provided with a blind hole and a through hole for mounting a connector. The blind hole and the through hole are the backdrilled blind hole and backdrilled through hole.

In conclusion, through the technical schemes of the embodiments of the present invention, in the case where the density of the connector is constant, wafers between lower layer of PCB may be doubled via considerable designing the crimping of PCB and connectors, namely by means of twice or more laminations, so that the wiring space between wafers may be doubled. In addition, according to the technical schemes of the embodiments of the present invention, the blind hole is backdrilled before multiple laminating, which may effectively reduce the length of the stub.

Apparently, a person skilled in the art may make various modifications and variations on the present disclosure without departing from the spirit and scope of the present disclosure. In this way, if the modifications and variations of the present disclosure fall within the scope of the claims of the present disclosure and equivalent technologies thereof, the present disclosure also intends to include the modifications and variations.

INDUSTRIAL APPLICABILITY

In the embodiments of the present disclosure, in the case where the density of the connector is constant, wafers between lower layer of PCB may be doubled via forming the blind hole by twice or more laminations, so that the wring space between wafers may be doubled. Furthermore, the stub in the crimping of the blind hole may be effectively reduced by backdrilling before multiple laminating. Therefore, the present disclosure has industrial applicability.

What is claimed is:

1. A printed circuit board PCB processing method, comprising:
   respectively carrying out lamination processing on a plurality of PCB daughter boards, and drilling and electroplating one of the plurality of PCB daughter boards to form a via hole; and
   stacking and laminating the plurality of PCB daughter boards together to form the PCB, wherein the one of the plurality of PCB daughter boards being drilled is a top-most PCB daughter board, the via hole becomes a blind hole of the PCB for mounting a first connector after the laminating, the blind hole extends only through the top-most PCB daughter board, and a depth of the blind hole is greater than or equal to a length of a signal pin of the first connector; and
   drilling and electroplating the PCB to form a through hole for mounting a second connector;
   after drilling and electroplating one of the plurality of PCB daughter boards to form a via hole, and before stacking and laminating the plurality of PCB daughter boards together to form the PCB, the method further comprising:
   backdrilling the via hole.

2. The method of claim 1, wherein the blind hole has a metallized part after backdrilling, and a length of the metallized part is greater than or equal to that of the signal pin of the first connector.

3. The method of claim 1, wherein drilling and electroplating the PCB to form a through hole for mounting the second connector comprises:
   drilling and electroplating the PCB at preset intervals to form multiple through holes for mounting the second connector.

4. The method of claim 3, after drilling and electroplating the PCB to form a through hole for mounting the second connector, the method further comprising:
   backdrilling at least one through hole.

5. The method of claim 1, after drilling and electroplating the PCB to form a through hole for mounting the second connector, the method further comprising:
   backdrilling at least one through hole.

6. The method of claim 1, further comprising:
   determining a position of the through hole and a position of the blind hole according to a wiring pattern of the PCB.

7. The method of claim 1, wherein the top-most PCB daughter board is formed by laminating a core board and a dielectric.

8. The method of claim 1, wherein a bottom-most PCB daughter board of the PCB is formed by directly processing a core board.

9. The method of claim 1, wherein a bottom-most PCB daughter board of the PCB is formed by laminating a core board and a dielectric.

10. A printed circuit board PCB, comprising:
    a plurality of PCB daughter boards stacked and laminated together,
    a blind hole of the PCB, and
    a through hole of the PCB;
    wherein a via hole is formed on a top-most PCB daughter board, the via hole becomes the blind hole after stacking and laminating the plurality of PCB daughter boards together, and the blind hole extends only through the top-most PCB daughter board;
    wherein the via hole on the top-most PCB daughter board is a via hole by backdrilling before stacking and laminating the plurality of PCB daughter boards together, and the through hole is a through hole by backdrilling.

* * * * *